(12) United States Patent
Schreiber et al.

(10) Patent No.: US 8,335,045 B2
(45) Date of Patent: Dec. 18, 2012

(54) EXTENDING THE STABILITY OF UV CURABLE ADHESIVES IN 193NM LASER SYSTEMS

(75) Inventors: Horst Schreiber, Corning, NY (US); Jue Wang, Fairport, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 13/032,102

(22) Filed: Feb. 22, 2011

(65) Prior Publication Data

US 2011/0205643 A1    Aug. 25, 2011

Related U.S. Application Data

(60) Provisional application No. 61/307,645, filed on Feb. 24, 2010.

(51) Int. Cl.
*G02B 7/02*    (2006.01)

(52) U.S. Cl. .......................................... 359/819; 359/820

(58) Field of Classification Search .................... 359/819
See application file for complete search history.

(56) References Cited

U.S. PATENT DOCUMENTS

| 6,097,536 | A | 8/2000 | Bauer et al. | |
| 7,081,278 | B2 | 7/2006 | Lipson et al. | |
| 7,242,843 | B2 | 7/2007 | Clar et al. | |
| 2007/0003208 | A1 * | 1/2007 | Clar et al. | 385/147 |
| 2008/0204862 | A1 | 8/2008 | Wang et al. | |
| 2009/0141358 | A1 | 6/2009 | Cangemi et al. | |

* cited by examiner

*Primary Examiner* — James Jones
(74) *Attorney, Agent, or Firm* — Walter M. Douglas (57) ABSTRACT

This disclosure is directed to an optical element and method in which a UV-curable adhesive, used along the edge of the optic to keep it in a holder, has been stabilized against degradation by below 300 nm radiation. The technical solution to the degradation of the adhesive includes both 193 nm scatter light reduction and protective coatings of plasma modified $AlF_3$ films on at least that part of the optical element that is in contact with the adhesive.

14 Claims, 9 Drawing Sheets

EXTENDING THE STABILITY OF UV CURABLE ADHESIVES IN 193NM LASER SYSTEMS

PRIORITY

This application claims the priority of the U.S. Provisional Patent Application No. 61/307,645 titled "Extending the Stability of UV Curable Adhesives in 193 nm Laser Systems" that was filed Feb. 24, 2010 in the name of inventors Horst Schreiber and Jue Wang.

FIELD

The disclosure is directed to the stabilization of UV (ultraviolet) curable adhesives is to through a combination of 193 nm scatter light reduction and the use of a new protective coating of a plasma-modified $AlF_3$ film on the at least a portion of the edge of an optic where the adhesive is applied.

BACKGROUND

In the semiconductor industry the dominant light in photolithograph process is the 193 nm excimer laser that operates in the DUV (deep ultraviolet) region. Calcium fluoride (CaF) crystals and high purity fused silica (for example, HPFS®, Corning Incorporated) are the most important optical materials used in the optical systems operated in the DUV spectral region. For example, an objective or projection system may comprise many $CaF_2$ and $SiO_2$ lens elements with multilayer antireflection (AR) coatings. These lens elements need to be precisely mounted onto stainless steel mounts and assembled together in a specific sequence to form an optical system. In practice, UV-curable adhesives have been extensively used to secure a lens element onto its corresponding stainless steel mount. In the mounting process, an adhesive polymer compound is applied between the lens element and the metal mount. Solidification of the polymer compound by UV irradiation, for example, 365 nm UV light, bonds the lens element to the metal mount. However, it is known that the scatter of 193 nm light in an optical system may degrade the UV-curable adhesive and eliminate its long term stability or lifetime, thus resulting in miss alignment of the optical system over time. There are two possible approaches to extend stability of the UV-curable adhesive. These are:

(1) reducing the 193 nm scatter light of an optical system, and (2) adding a selected protective coating to the optical element to prevent 193 nm scatter light damage at the adhesive-optical element boundary layer so that the adhesive is not degraded by 193 nm radiation.

The general idea of the protective coating is to insert a dielectric film between a lens element and its surrounding UV-curable adhesive. The dielectric film transmits the UV curing light at 365 nm and blocks 193 nm scatter light. The protective coating approach has been realized by means of physical and chemical deposited oxide films as described in, for example, in U.S. Pat. No. 6,097,536 (the '536 patent) a protective layer of $Ta_2O_5$, $TiO_2$, $HfO_2$ is deposited by vapor deposition of the material), and in U.S. Pat. No. 7,081,278 (the '278 patent), chemical deposition of metal oxide films such as $SiO_2$, $Al_2O_3$, $ZrO_2$, $HfO_2$, $Ta_2O_5$, $Nb_2O_5$, and $TiO_2$ using a sol-gel type process in which an organo-oxy metallic compound is used as chemical precursor followed by hydrolysis and condensation to form a metal oxide film after drying).

Other, different protective solutions involving new bonding materials and processes have also been under investigation. For example, Precision Photonics Corporation (www.precisionphotonics.com) recently claimed that a chemically activated direct bonding (CADB™) technology has been developed resulting in epoxy-free optical paths that are perfectly transparent with negligible scattering and absorptive losses at the bonding interfaces. The CADB technology is claimed to offer bond strengths often times equal to the strength of the bulk materials being bonded. However, the CADB™ technology is only good for bonding optically smoothed and flatted glass surfaces, but not for glass-metal contacts or rough surfaces.

Directly and indirectly protective coatings have also been applied to fluoride optics operating at 193 nm for reasons other than protecting UV-curable adhesives from degradation. U.S. Pat. No. 7,242,843 (the '843 patent) describes the use of a single layer of dense F—$SiO_2$ (a fluorine doped silica) coating as a directly protective coating to prevent fluorine depletion in $CaF_2$ optics under 193 nm light irradiation, leading to a prolonged lifetime of the F—$SiO_2$ protected $CaF_2$ optics. In US 2008/0204862, F—$SiO_2$ layers are inserted between fluoride coating stacks on the surface of the optic through which light passes as indirectly protective coatings (of the layers below the F—$SiO_2$ coating), and enable plasma smoothing and densification of fluoride coating layers and stacks without introducing additional absorption.

Thus, while advances have been made in protecting the UV-curable adhesives used for the bonding of optical elements to, for example, holders, there is a need for further improvement regarding such protection. The present disclosure present a novel method for protecting the adhesives used to bond optical elements used in DUV lasers to their holders so that the adhesive is not degraded in use.

SUMMARY

The present disclosure shows that a combination of 193 nm scatter light reduction and a new protective coating with plasma modified $AlF_3$ film leads to stabilization of UV-curable adhesive. To summarize the disclosure:

A. 193 nm scatter light is reduced in 193 nm laser systems via
 1. The use of select appropriate fluoride coating materials to reduce scatter light.
 2. Optimizing heating processes to densify coatings and to reduce scattered light.
 3. Mitigation of fluoride film microstructure structure to reduce scatter light.
 4. A densified and smoothed silica layer deposited on top of the fluoride layers to reduce scatter light.

B. The use of plasma modified $AlF_3$ films as edge protective coating for the UV-curable adhesive, the protective coating being optimized by:
 1. Plasma momentum transfer
 2. The protective film deposition rate and the use of an $Ar/O_2$ gas mixture for the plasma used in the deposition of the edge coating.
 3. The use of an optional post-deposition heat treatment of the deposited edge protective film in air or oxygen containing inert gas, for example, a 5% oxygen/helium or oxygen/nitrogen mixture at a temperature in the range of 200-300 degrees.

The present disclosure also describes a method for depositing the fluoride films and for modifying a commercially available vacuum thermal evaporation coater to enable the fluoride films to be deposited and selectively plasma modified on CaF$_2$ and silica substrates, and to provide for uniform heating of the CaF$_2$ substrate. The disclosure describes the steps of extending the radiation spectrum of coater's ceramic heaters into CaF$_2$ IR absorption band; equalizing the temperature ramping profile of the CaF$_2$ lens-carrying basket (typically an aluminum container) to that of CaF$_2$ lens itself by partially thermally insulating the outside of the basket: and reducing the total heating energy consumption by using high reflective, mirror-like Al foils to thermally insulate chamber walls and basket-carrying plate.

The disclosure also describes an optical element consisting of an optic having two faces, whether curved or flat, and an edge surface formed by said faces. The optic can be a silica or single crystal fluoride of a Group 2A alkaline earth metal fluoride, for example without limitation, calcium fluoride or magnesium fluoride. In an embodiment the optic is CaF$_2$. In another embodiment the optic is silica, for example without limitation, HPFS® (High Purity Fused Silica, Corning Incorporated). The edge of the optic has a coating thereon consisting of a base coating of a densified, thermally deposited single fluoride coating material, for example, AlF$_3$, deposited said at least part of said CaF$_2$ edge. The faces of the optic have (1) a base coating layer of AlF$_3$ applied to one or both faces of the optical faces and (2) one or a plurality of coating periods, each period consisting of (1) a thermally deposited selected binary metal fluoride coating layer and (b) a single fluoride coating layer deposited on top binary layer deposited on the base layer. The number of periods "n" is in the range of n=1-5. Thus, an optic has a base AlF$_3$ layer deposited on an optic's face, a first period in which the binary fluoride coating is coated on top of the base AlF$_3$ layer and a single fluoride layer deposited on top of the binary fluoride layer. If "n" is greater than one, the same order of binary fluoride coating followed by single fluoride coating is followed until the desired number of periods has been obtained. Optionally, after all the periods have been deposited a layer of silica can be deposited on top of the last period's single fluoride layers. In one embodiment the deposited silica layer is a densified silica layer having a thickness in the range of 10-70 nm. In a further embodiment the optic also has a UV-curable adhesive applied to at least part of the AlF$_3$ edge coating.

The fluoride coating materials are transmissive to UV curing radiation and transmit less than 5% of any below 200 nm radiation striking said selected coating materials. The binary metal fluoride coating materials are an A/B type where A is a low refractive index fluoride material, for example, a Group 2A metal fluoride or AlF$_3$, and B is a high refractive index lanthanide fluoride MF$_3$. In an embodiment the A is selected from the group consisting of MgF$_2$ and AlF$_3$. In an embodiment MF$_3$ is selected from the group of LaF$_3$ and GdF$_3$. Exemplary binary pairs include, without limitation, AlF$_3$/GdF$_3$, MgF$_2$/GdF$_3$, and MgF$_2$/LaF$_3$. The "single fluoride material" is selected from the group consisting of MgF$_2$ and AlF$_3$. In the composition, in weight percent, is A=5-20% and B=80-95%.

The thickness of the base AlF$_3$ layer on the face and the edge is in the range of 10-25 nm and 350-550 nm, respectively. Within each period, the thickness the binary fluoride layer A/B is in the range of 25 nm to 75 nm and the thickness of the thermally deposited metal fluoride is in the range of 25-45 nm. When a plasma modified SiO$_2$ layer is applied over the last period the SiO$_2$ layer has a thickness in the range of 10-70 nm.

DETAILED DESCRIPTION

Herein an operating system operating at 193 nm has been used as an exemplary system. However, the techniques described herein are not limited to 193 nm, but can be applied to any optical system operating below 300 nm, for example, optical systems operating at 193 nm, 213 nm, 248 nm and 266 nm. In one embodiment the techniques are use in below 250 nm laser systems. Also herein, CaF$_2$ lenses are used, without limitation, as exemplary optical elements. Optical elements made from other materials can also be used in accordance with this disclosure; for example, high purity fused silica (HPFS®, Corning Incorporated). Also herein the term "binary metal fluorides" means that two different metal fluorides as described herein are co-deposited such that the resulting coating layer is a mixture of the two metal fluorides.

As has been indicated above, a protective coating for UV-curable adhesives can be accomplished by inserting a dielectric film between a lens element and its surrounding UV curable adhesive. The dielectric film is selected such that it transmits the UV curing light at 365 nm and blocks 193 nm scatter light from ArF laser. Both physical vapor deposited and chemically derived dielectric films have been used as protective coatings for UV-curable adhesive.

In this disclosure a combined technical solution has been developed to stabilize of UV-curable adhesive in below 300 nm systems, for example in 193 nm systems that are used herein as an exemplary system. The technical solution includes both 193 nm scatter light reduction and protective coatings of plasma modified $AlF_3$ films on at least that part of the optical element that is in contact with the adhesive. That is, both 193 nm scatter light reduction and protective coatings are employed in this invention.

It is known that the degradation of UV cured adhesive is dominated by 193 nm scatter light. Reduction of scatter light as a result of optical coatings plays a significant role for the long term stability of the UV-curable adhesive. However, the only protective coating approaches known are those considered in the '536 and '278 patents described above. The protective coating developed and described in this enclosure invention is a plasma modified $AlF_3$ film, which differs from the '536 and '278 patent with regard to the coating materials and the coating deposition methods.

Exemplary fluoride materials $AlF_3$, $LaF_3$, $MgF_2$ and $GdF_3$ were evaluated in terms of optical, mechanical and micro-structural properties. $AlF_3$ is a good replacement of $MgF_2$ as low refractive index coating material due to its amorphous and homogeneous film structure. For a high refractive index material, $GdF_3$ is better than $LaF_3$ in terms of optical, mechanical and micro structural properties. The different binary combinations of binary fluoride coatings for low-scatter, adhesive-protecting 193 nm coatings include $AlF_3/GdF_3$, $MgF_2/GdF_3$, $MgF_2/LaF_3$ and $AlF_3/LaF_3$. In one embodiment the binary fluoride coating material is $AlF_3/GdF_3$.

Figure 1:
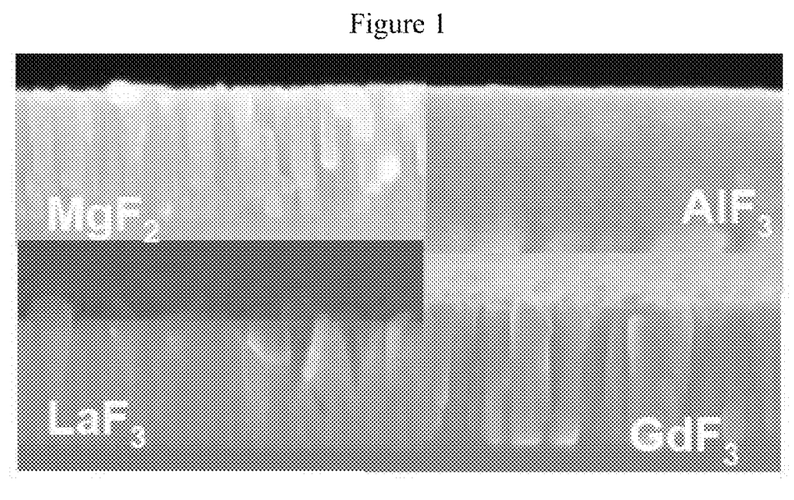
FIG. 1 shows the SEM cross-sectional images of single layers of selected materials deposited on CaF$_2$ (111).
Figure 2:
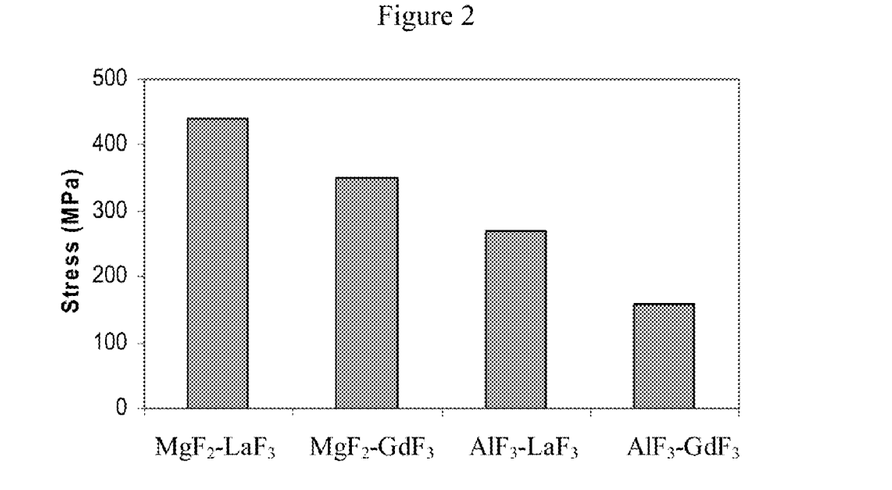
FIG. 2 is a bar chart illustrating the stress comparison of 2-layer fluoride coatings on CaF$_2$ (111).

FIG. 1 is consists of SEM cross-sectional images comparing the micro-structure of single layers of $MgF_2$, $AlF_3$, $LaF_3$ and $GdF_3$ on $CaF_2$ (111) surfaces). The columnar film structure for $LaF_3$, $GdF_3$ and $MgF_3$ single layers can be seen in the SEM images, whereas $AlF_3$ film has the most homogeneous cross-sectional structure FIG. 2 illustrates the stress value of the combinations of, from left to right, $MgF_2/LaF_3$, $MgF_2/GdF_3$, $AlF_3/LaF_3$, and $AlF_3/GdF_3$. AlF3/GdF3 combination has the lowest tensile stress. This is believed due to the crystal structural similarity between $GdF_3$ and $CaF_2$, which is not the case for $MgF_2$ and $LaF_3$. When the spacing between the columns of $GdF_3$ are filled in by $AlF_3$, less stress is created than when $AlF_3$ fills the $LaF_3$ columnar structure or when $MgF_2$ is used as the filing material for either the $GdF_3$ or $LaF_3$ columnar structures.

Figure 3:
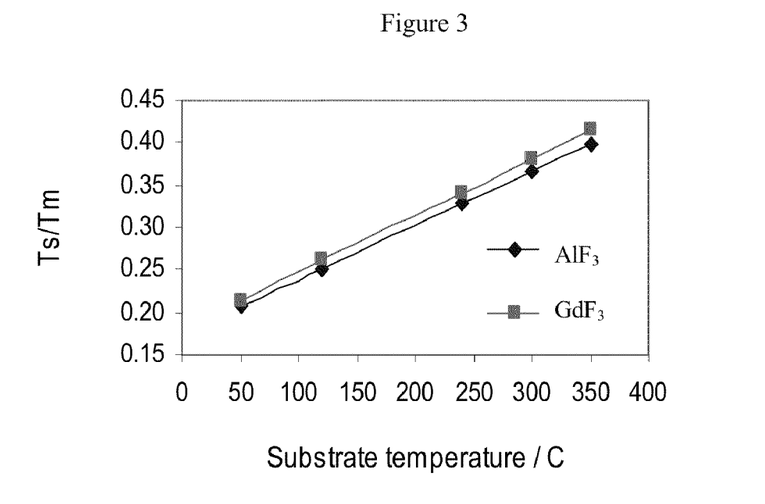
FIG. 3 is a graph illustrating the ratio of Ts/Tm of AlF$_3$ and GdF$_3$ films as a function of substrate temperature.

For a laser operating at 193 nm, the use of energetic deposition processes for depositing fluoride materials is restricted. Consequently, thermal resistance evaporation of fluoride coating materials onto $SiO_2$ and $CaF_2$ lens surfaces at relatively high substrate temperatures is an alternate method to densify the fluoride films and reduce 193 nm scatter light. The film structure changes dramatically with the amount of the thermal motion taking place during film growth, which scales with the ratio of the substrate temperature "Ts" to the melting point of the film "Tm." To ensure that surface diffusion becomes significant during film growth, a Ts/Tm temperature ratio of greater than 0.35 is desired for $AlF_3$ and $GdF_3$. FIG. 3 is a graph showing the ratio of Ts/Tm for $AlF_3$ and $GdF_3$ as a function of substrate temperature. The graph indicates that the desired temperature ratio corresponds to a substrate temperature greater than 250° C. for $AlF_3$ and $GdF_3$ films.

Micro Structure Mitigation of Fluoride Films for Low Scatter Coatings

Because of the surface curvatures of lens elements, the fluoride coating has to be deposited on a non-(111) surface of $CaF_2$ substrates and on amorphous $SiO_2$ substrates. There are significant structural differences of $GdF_3$ films grown on $CaF_2$ (111) and $SiO_2$ substrates as has been described by Wang et al, "Structural comparison of $GdF_3$ films grown on $CaF_2$ (111) and $SiO_2$ substrates," Applied Optics Vol. 47 (23), page 4292 (2008). Additional information about $GdF_3$ and other fluoride films such as $MgF_2$, $AlF_3$ and $LaF_3$ films, can also be found in U.S. Patent Application Publications Nos. 2008-0204862 (Engineered Fluoride-Coated Elements for Laser Systems, Wang et al, and 2009-0141358 (Dense Homogeneous Fluoride Films for DUV Elements and Method of Preparing Same, Wang et al). The inhomogeneity and surface roughness of $GdF_3$ film grown on amorphous $SiO_2$ substrate or on a non-(111) surface of a $CaF_2$ substrate increases dramatically when compared to that grown on (111) $CaF_2$ surface, leading to high scatter loss. The micro-structure of $GdF_3$ film is clearly revealed in FIG. 1 which shows SEM cross sectional images of $MgF_2$, $AlF_3$, $LaF_3$ and $GdF_3$ films grown in a $CaF_2$ (111) surface. A co-deposition technique to control $GdF_3$ crystal growth and to fill the voids between $GdF_3$ crystal grains with amorphous $AlF_3$ was developed and described in the above U.S. patent application to Wang et al, leading to improved homogeneity of $GdF_3$ micro structure and smoothed film surface. As a result, 193 nm scatter light is further reduced in optical systems comprised of coated lens elements.

Plasma Ion Assisted $AlF_3$ Films as Protective Coatings

Plasma-ion assistant deposition (PIAD) has been extensively used for oxide coatings. Film optical, mechanical and micro-structure can be modified by means of plasma ion interaction with deposited oxide materials. Recent development indicates that both fluoride crystals such as $CaF_2$ and fluoride films can be protected or indirectly modified by PIAD derived oxide films, especially F—$SiO_2$ film for 193 nm applications. A single layer of dense F—$SiO_2$ coating prevents fluorine depletion from $CaF_2$ optics under 193 nm light irradiation, leading to a prolonged lifetime of the F—$SiO_2$ protected $CaF_2$ optics. Inserted F—$SiO_2$ layers between fluoride coating stacks enable plasma smoothing and densification of fluoride coatings without introducing additional absorption. A plasma modified $SiO_2$ film can optionally be deposited as a protective layer over the last binary fluoride-single fluoride period described herein.

Figure 4:
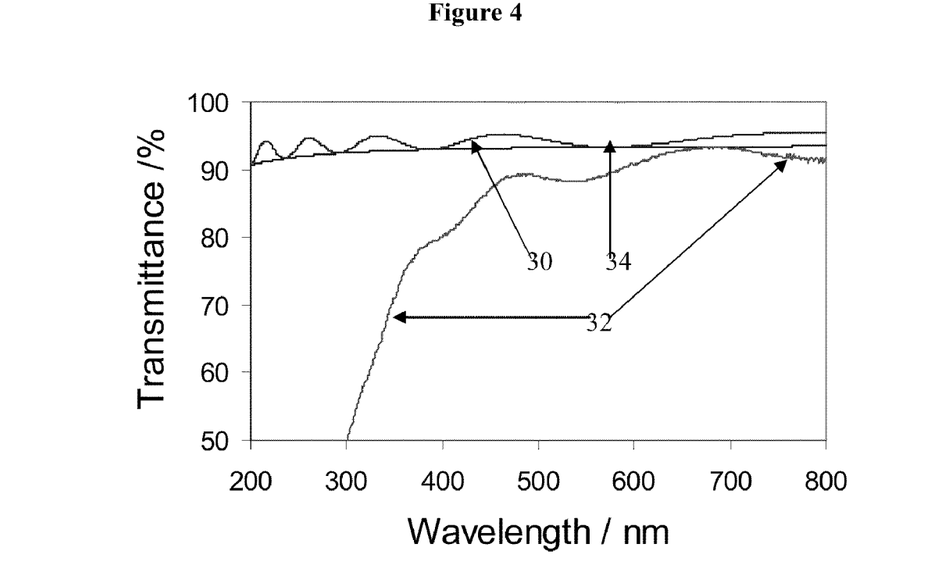
FIG. 4 is a graph illustrating the spectral transmittance of thermally evaporated an AlF$_3$ film 30 and a plasma modified AlF$_3$ film 32 on SiO$_2$ substrates 34.

However, direct interaction of plasma ions with fluoride crystals or fluoride coatings increases absorption loss at short wavelengths. That is why thermal evaporation of fluorides enables low loss coatings at 193 nm. Here we take advantage of the plasma interaction with $AlF_3$ material to obtain a short-wavelength-barrier for the UV-curable adhesives. In other words, the plasma modified $AlF_3$ film blocks 193 nm scatter light and transmits 365 nm for UV curing light. FIG. 4 plots spectral transmittance of thermal evaporated $AlF_3$ film curve 30 and plasma modified $AlF_3$ film curve 32 on $SiO_2$ substrates 34. The thermal evaporated $AlF_3$ film shows high transmittance from 800 nm down to 200 nm and even below, whereas strong absorption appears in the plasma modified $AlF_3$ film at wavelength below 300 nm.

Figure 5:
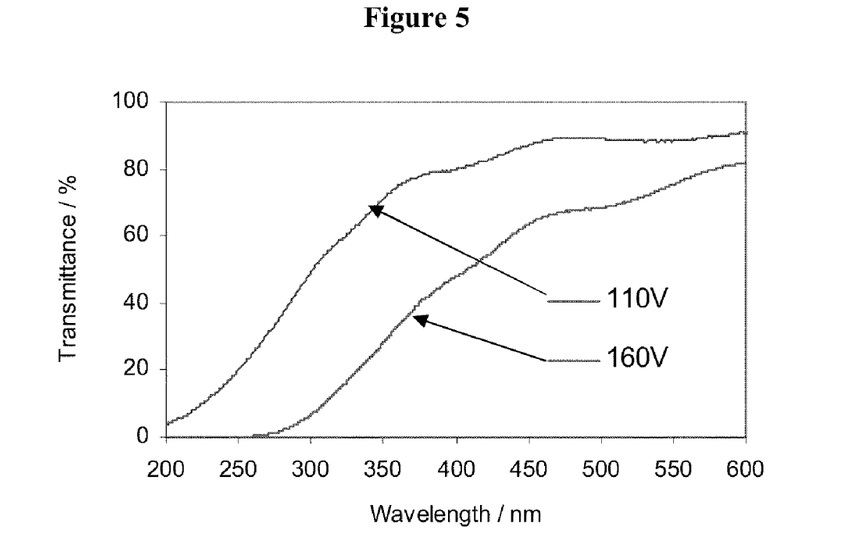
FIG. 5 is a graph illustrating the spectral transmittance of plasma modified AlF$_3$ films on SiO$_2$ substrates at a bias voltages of 110V and 160V, respectively.
Figure 6:
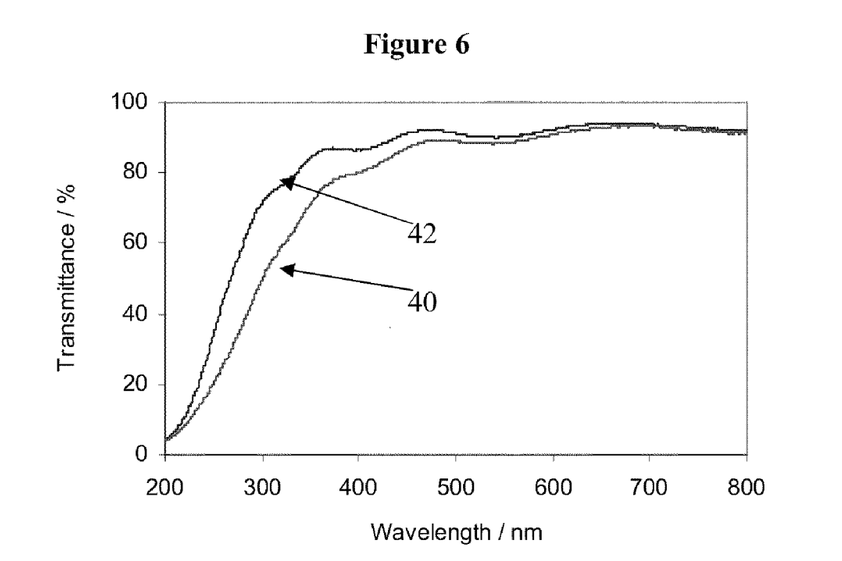
FIG. 6 illustrates spectral transmittance of plasma modified AlF$_3$ films on SiO$_2$ substrates with post-deposition annealing curve 42 and without post deposition annealing curve 40.
Figure 7:
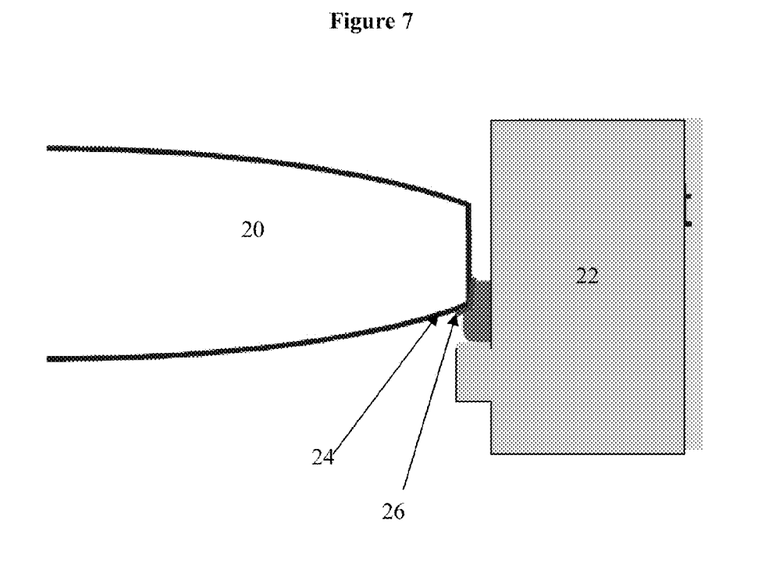
FIG. 7 is a schematic of a lens 20 held by a mount 22 via UV-curable adhesive 26 with a plasma modified AlF$_3$ film 24 (the |-shaped element) as a short-wave barrier or a protective coating between lens and the adhesive.

The absorption edge of the plasma modified $AlF_3$ films is strongly related to the amount of plasma interaction during or after the film deposition. In other words, the absorption edge of plasma modified $AlF_3$ films can be shifted by varying deposition rate, bias voltage, gas flow ratio of $O_2$ and Ar etc. For example, FIG. 5 plots spectral transmittance of plasma modified $AlF_3$ films on $SiO_2$ substrates with then the $AlF_3$ is deposited using plasmas having bias voltages of 110V and 160V, respectively. A reduction of bias voltage from 160V to 110V leads to ~100 nm blue-shift of the absorption edge. The slope of the absorption edge can also be adjusted by post deposition annealing. FIG. 6 plots spectral transmittance of plasma modified $AlF_3$ films on $SiO_2$ substrates with and without post deposition annealing, corresponding to curve 42 and curve 40 in FIG. 6, respectively. The plasma modified $AlF_3$ film is a good candidate as a new protective coating for UV-curable adhesive. FIG. 7 is a schematic of a lens held by a mount using a UV curable adhesive with a plasma modified $AlF_3$ film as a short-wave barrier or a protective coating between lens and the adhesive. The short-wave barrier has high transmission at 365 nm, and high absorption at wavelength of 193 nm optical systems.

A method of homogeneously heating $CaF_2$ lens elements to the desired temperature for low scatter coatings has been developed. The method requires that a typical, commercially available thermal evaporation apparatus be modified as described herein in order to properly coat the $CaF_2$ elements. The three modifications required to enable the formation of low scatter coatings at an elevated temperature via directly heating a $CaF_2$ substrate are as follows:

Step 1 is to extend the radiation spectrum of apparatus' ceramic heaters into $CaF_2$ absorption band.

Step 2 is to equalize temperature ramping profile of the $CaF_2$ lens-carrying basket (typically an aluminum container) to that of $CaF_2$ lens itself by partially thermally insulating the outside of the basket.

Step 3 is to reduce the total heating energy consumption by using high reflective, mirror-like Al foils to thermally insulate chamber walls and basket-carrying plate. A commercial coater, modified as described as described above, produces coating that both reduce scatter and protect from degradation the adhesive used to adhere the elements to a surface.

The Modified Vacuum Thermal Evaporation Coater

Figure 8:
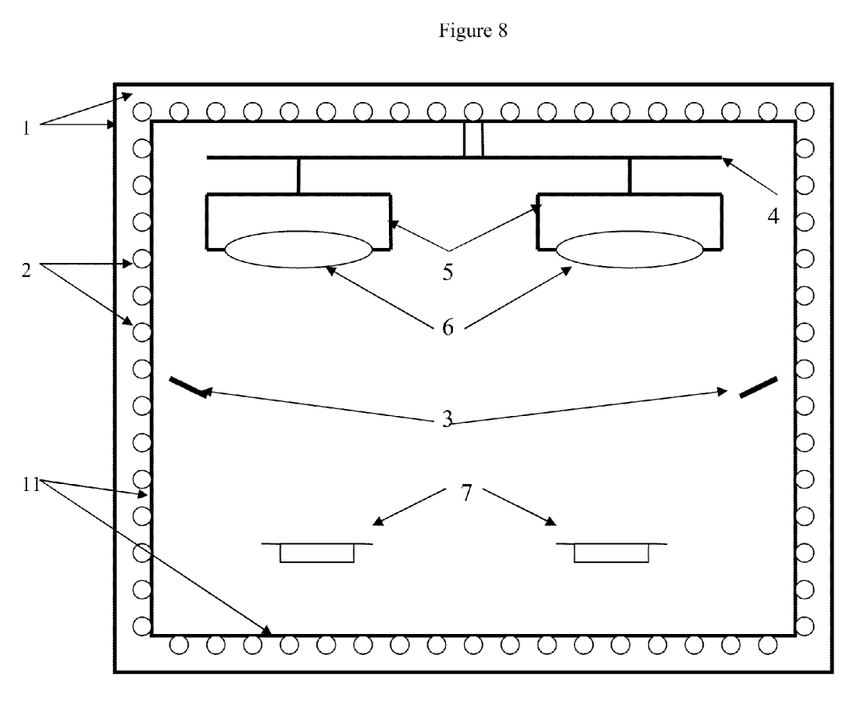
FIG. 8 is a schematic cross-sectional view of a typical vacuum thermal evaporation coater used for the deposition of materials on optical elements.
Figure 9:
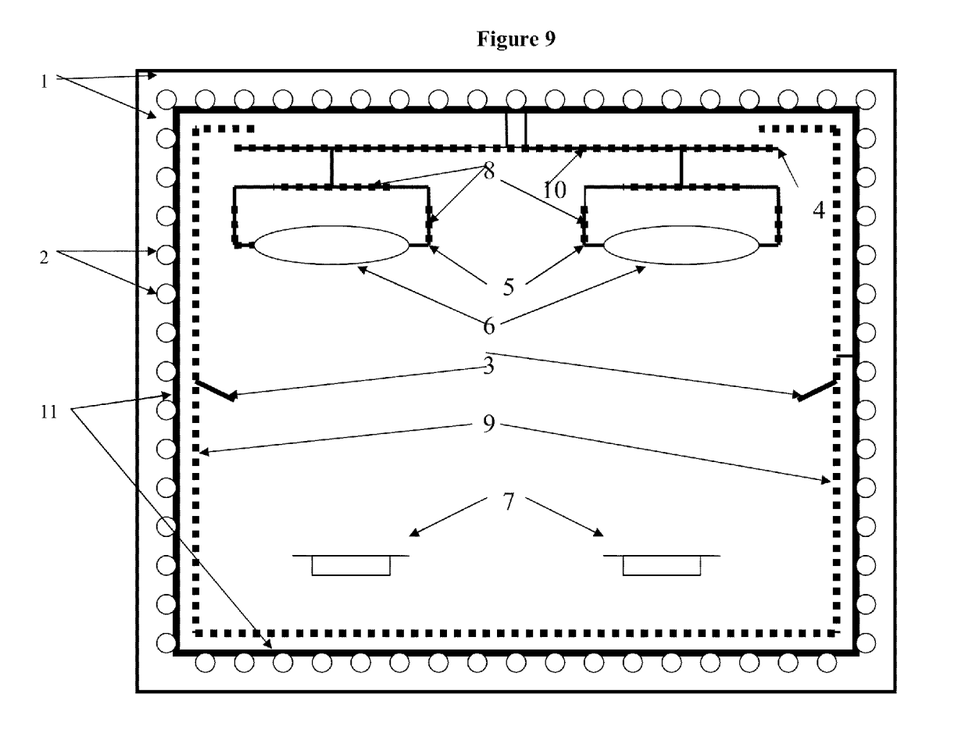
FIG. 9 is a schematic cross-sectional view of a vacuum thermal evaporation coater that has been modified as described in this disclosure and is used to deposit the fluoride materials on optical elements.

FIG. 8 is a schematic of a standard, commercially available, vacuum thermal evaporation coater used to coat optical elements. In FIG. 8 the numbered elements are the vacuum chamber walls 1 having an exterior surface (unnumbered) and an interior surface defined by line 11 with cooling water tubes 2 within walls1, and, located within the vacuum chamber itself which is defined by line 11, are ceramic heaters 3, at least one basket carrying plate 4, at least one optical element carrying basket 5 (for example, for carrying an optical lens), optical lenses 6 in the two carrying baskets illustrated in FIG. 8, and thermal evaporation sources 7 that are used to supply, heat and evaporate the coating material to be deposited on an optical element surface. For use with fluoride materials the standard coater set-up is modified in accordance with the above Steps 1-3 as illustrated in FIG. 9. In both FIGS. 8 and 9 elements such as vacuum ports, electrical ports and connections, viewing ports and similar items are not illustrated.

FIG. 9 is a schematic of an exemplary thermal evaporation coater that has been modified according to this disclosure, and that was used to deposit the fluoride coating materials described herein. In FIG. 9 the numbered elements are the vacuum chamber walls 1 having an exterior surface (unnumbered) and an interior surface (defined by solid line 11) with cooling water tubes 2 within chamber wall 1, and, located within the vacuum chamber defined by the solid line 11, ceramic heaters 3, at least one basket carrying plate 4, at least one optical element carrying basket 5 (for example, for carrying an optical lens), optical lenses 6 in the two carrying baskets illustrated in FIG. 9, thermal evaporation sources 7 that are used to heat the coating material, mirror-like Al foils 8 serving to partially insulate the baskets 5, mirror-like Al foils 9 for insulation of the interior chamber wall, and mirror-like Al foils 10 for thermal insulation of the basket carrying plate 4. In FIG. 9 the area covered by the mirror-like Al foils 8, 9 and 10 is represented by the black squares that, in some instances, are superimposed on other elements, for example, the basket carrying plate and the carrying basket.

Directly Heating $CaF_2$ Lenses with Infrared (IR) Radiation

Figure 10:
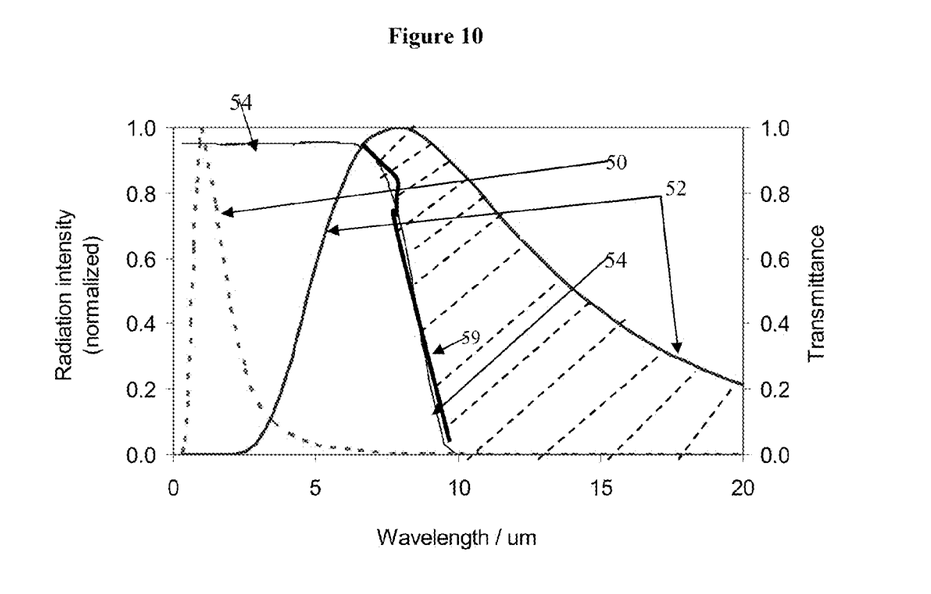
FIG. 10 illustrates the spectra of heater radiation intensity (normalized) at full heating power 50 and a reduced heating power 52, with the transmittance spectrum of CaF$_2$ (54) included for comparison.

The application of using energetic deposition processes is restricted for fluoride materials (for example, fluoride crystals) because of fluoride depletion of these materials during energetic particle bombardment. Therefore, thermal resistance evaporation of fluoride coating materials on $CaF_2$ lens surfaces at relative high substrate temperatures (~300° C.) is required both to deposit the fluoride coating material without depletion of its fluoride content and to densify fluoride films deposited on the substrate, for example, $CaF_2$ elements. However, in order to heat, for example, a $CaF_2$ lens element in a thermal evaporation chamber, which operates under high vacuum, it is important to understand different heat transfer mechanisms and to compare their relative contribution. Generally, heating includes solid conduction, gas conduction and radiation conduction. In a vacuum thermal evaporation coater the $CaF_2$ are held by lens-carrying baskets. $CaF_2$ is transparent in the near infrared and middle infrared spectral regions and, since the coating is done in high vacuum, there is no gas conduction. As a result, the $CaF_2$ lenses are heated up via solid conduction with lens-carrying baskets, the heat flow being from the carrying basket to the lens. As a result, a full power setting of the ceramic heaters is required in order to heat the $CaF_2$ lenses up to 300° C. in a standard vacuum coater. FIG. 10 illustrates the spectra of heater radiation intensity (normalized, left hand vertical axis)) at full heating power (curve 50) and a reduced heating power (curve 52), with the transmittance spectrum (right hand vertical axis) of $CaF_2$ (curve 54) included for comparison. The overlap of the peak radiation intensity of full power curve 50 with the transparent region 54 of the $CaF_2$ element, the area below 10 µm wavelength, is clearly indicated. When the heaters are operated at full power, the radiation passes through $CaF_2$ lenses and, instead of heating the $CaF_2$ lens elements, heats lens-carrying baskets and the basket-carrying plate among other things. As a result of the IR transparency of the $CaF_2$ elements, heat transfer to the $CaF_2$ elements is by conduction between a $CaF_2$ lens and a lens-carrying basket in a standard heating process for AR coatings in which the majority of radiation is absorbed by the lens-carrying basket. The lens-carrying basket, which has a large surface area, absorbs the IR radiation and heats up rapidly. The relatively cold $CaF_2$ lens is heated via solid thermal conduction through the limited area where the $CaF_2$ element contacts the basket. As a result, the localized heat transfer between the carrying basket and the element leads to highly localized thermal stress and surface deformation of the $CaF_2$ as a result of the activation of crystal slip systems.

It has been found that it is possible to shift the radiation spectrum of the ceramic heaters 3 by changing their power setting. In addition to illustrating the heater radiation intensity (normalized) operating at full heating power, FIG. 10 also illustrates the heater radiation intensity (normalized) and wavelength range when the heater is operated at reduced heating power as is illustrated by curve 52. As curve 52 shows, at a reduced heater power setting the radiation peak 50 shifts to $CaF_2$ radiation absorption edge shown as portion 59 of curve 54. As FIG. 10 illustrates, the overlap of radiation intensity with a transparent region of $CaF_2$ decreases from 100% at the full power setting down to ~50% when the heaters are operated at a reduced power setting (heaters operating at ~25% power) as shown by the hatching. Stated differently, when the power to heaters is reduced, the infrared wavelength distribution from the heaters is shifted and broadened so that approximately 50% of the heater's radiation intensity is absorbed by the whole $CaF_2$ lens through its volume as is indicated by the hatched area of curve 52. A further advantage to this manner of by $CaF_2$ bulk absorption is that it automatically compensates for the effect of lens thickness difference, and reduces thermal generated stresses and surface deformation within $CaF_2$ lens.

Since the size and power of the heaters in the vacuum thermal evaporation coaters may vary from coater-to-coater, it will be necessary to experimentally determine the power settings required to assure that there is overlap between the heater's IR radiation curve and the $CaF_2$ IR absorption curve as is illustrated on FIG. 10 so that the $CaF_2$ will be heated. In addition, the power range will have to be selected to so that the $CaF_2$ optic is heated to a temperature above 250° C., and preferably to a temperature in the range of 275-325° C.

Equalizing the Temperature Ramping Profile of $CaF_2$ Lens-Carrying Basket to that of $CaF_2$ Lens.

Figure 11:
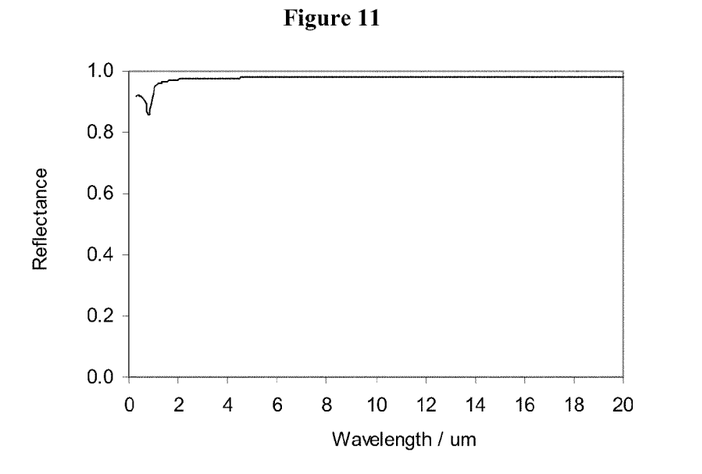
FIG. 11 is a graph illustrating the spectral reflectance of a mirror-like Al foil in the wavelength 2-10 μm.

After increasing $CaF_2$ bulk absorption to IR radiation as described above, the second technical step is to equalize the temperature ramping profile of the lens-carrying basket to that of the $CaF_2$ lens. There is no thermal gradient between the basket and the lens if the temperature profiles of the two are equalized. Consequently, there is a need to reduce the heating efficiency of the baskets used to carry $CaF_2$ lenses for AR coatings. This can be accomplished by using mirror-like Al foil, or other mirror-like foils, to insulate the basket from IR radiation heating. FIG. 11 is a graph illustrating the spectral reflectance of a mirror-like Al foil. Since the heating in the vacuum chamber is dominated by the radiation, the high reflectance of Al foil enables one to control the temperature ramping profile by partially insulating the baskets from the direct IR radiation.

Figure 12:
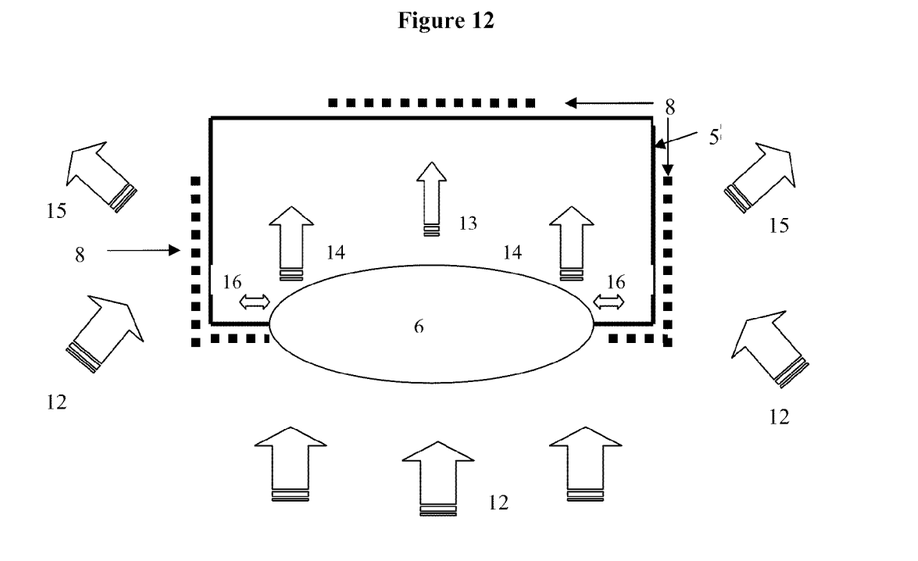
FIG. 12 is a schematic diagram showing heat transfer between a lens-carrying basket 5 and a CaF$_2$ lens element 6 under heater radiation 12 in a modified heating process during AR coating.

FIG. 12 is a schematic diagram showing heat transfer between a lens-carrying basket 5 and a $CaF_2$ lens element 6 under heater radiation 12 in a modified heating process during AR coating. In FIG. 12 the Al foil 8 shielded areas can be adjusted based on the temperature ramping profile of the $CaF_2$ lens 6. Incoming IR radiation from the ceramic heaters is illustrated by numeral 12. IR radiation reflected by the Al foil 8 is illustrated by numeral 15. Numeral 13 and 14 represent IR radiation partially transmitted through the main bulk thickness of the lens and through the lens edge area, respectively. In addition, the temperature ramping profile of the basket 5 and the lens 6 can be further optimized by a multi-step power setting, in which the peak radiation is shifted to balance the absorptions between the $CaF_2$ and the unshielded basket.

Figure 13:
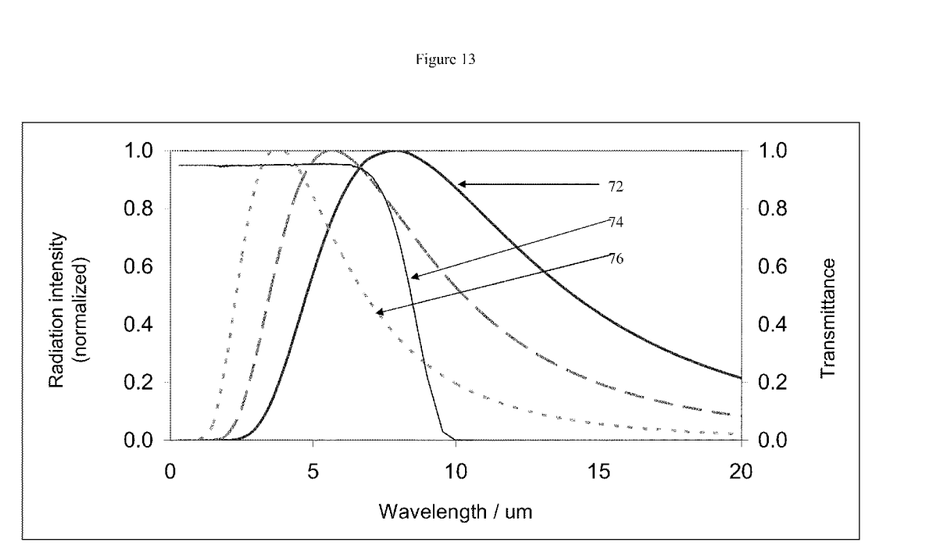
FIG. 13 shows spectra of heater radiation intensity (normalized) with a multiple-step power setting.

FIG. 13 shows spectra of heater radiation intensity (normalized) with a multiple-step power setting. The two adjustments result in an optimized equalization of both the temperature ramping profiles of the basket and the lens. It is also worthwhile to note that the transmitted IR radiation at lens center area (13) is less that around the lens edge area (14) as illustrated in FIG. 12. That means more radiation heating occurs in the area where the lens is thick, that automatically compensates for the lens thickness difference and further reduces thermal gradient effect.

Reducing The Total Heating Energy Consumption

The steps recited above enable one to homogeneously heat $CaF_2$ lenses in the modified vacuum coater described herein. However, in order to reach an elevated temperature such as 300° C., an additional step is required which is to reduce the total heating energy consumption of the vacuum coater itself. As shown in FIG. 9, the vacuum coater wall 1 is water cooled; and the total area of the wall is much greater than that of the lens-carrying baskets 5 and the $CaF_2$ lenses 6. As a result, the majority of heating energy is consumed by the wall 1, particularly at surface 11, instead of the lenses to be coated. Using the mirror-like Al foil as described herein thermally insulates the interior walls 11 and the basket-carrying plate 4 to reduce unnecessary heating energy consumption. The reflected radiation from the Al foil heats the $CaF_2$ lenses and the selected area of the lens-carrying basket not covered by the Al foil. As a result, a significant increase of heating efficiency is realized. With the modified chamber configuration of FIG. 9, calculations indicate that the heating efficiency is increased by a factor of 4; that is, a 25% heating power setting equalizes to a full power setting. The result of the foregoing steps is that the $CaF_2$ lenses and lens-carrying-baskets are homogeneously heated with the same temperature ramping profile. The equalized temperature ramping profile of $CaF_2$ lens and lens-carrying basket reduces thermal gradient in $CaF_2$ lens and thus reduces thermal generated stresses and surface deformation within $CaF_2$ lens.

EXAMPLE

Figure 14:
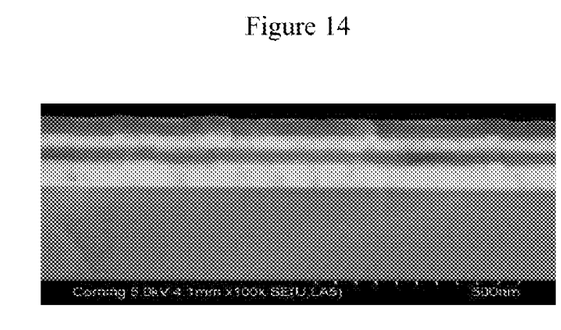
FIG. 14 is a SEM cross-sectional image showing a 5-layer AR coated CaF2 lens using the techniques described in this invention.
Figure 15:
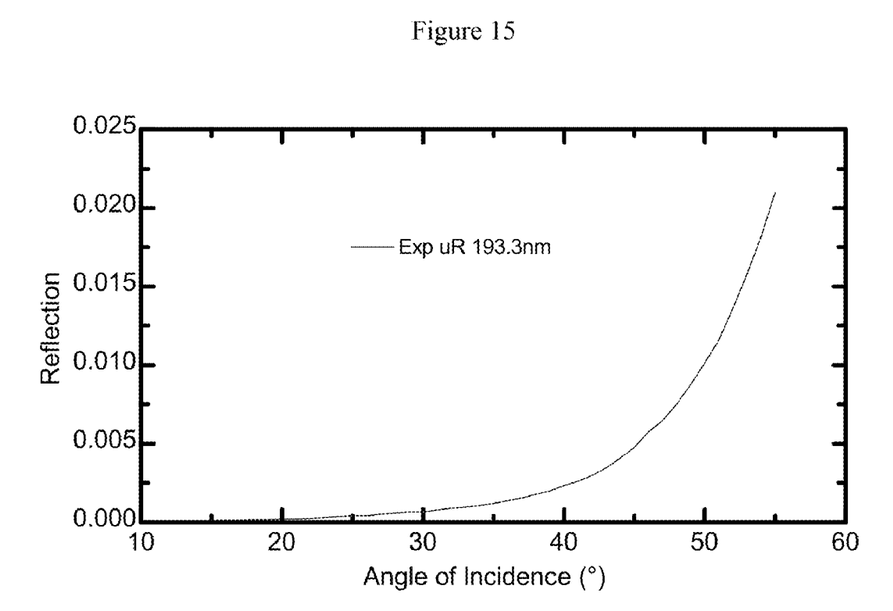
FIG. 15 plots 193.3 nm reflectance as a function of angle of incidence on the 5-layer AR coated CaF2 lens; and the measured reflectance is less than 0.5% at an angle of incidence up to 45°.

FIG. 14 shows SEM cross-sectional image of a 5-layer AR coated face of a CaF2 lens using the techniques described in this invention. Starting from the $CaF_2$ surface, the 5-layer comprises a 20 nm $AlF_3$ base layer, a first period consisting of a 64 nm of a binary 90% $GdF_3$ and 10% $AlF_3$ layer and a 38 nm $AlF_3$ layer, and a second period consisting of a 31 nm binary 90% $GdF_3$ and 10% $AlF_3$ layer and a 37 nm $AlF_3$ layer. The base $AlF_3$ layer and the two periods of two layers result in the five layer coating. As can be seen, GdF3 film structure mitigation is realized via the $AlF_3$ insertion and the special heating procedure described herein. FIG. 15 plots 193.3 nm reflectance as a function of angle of incidence on the 5-layer AR coated CaF2 lens. The measured reflectance is less than 0.5% at an angle of incidence up to 45°. The edge of the lens has only an $AlF_3$ coating along at least a portion of the edge which is applied in the same apparatus. The edge coating can be applied either before or after the face or faces are coated. When the edge is first coated the face is masked to prevent it from being coated during the edge coating. If the face is first coated with an $AlF_3$ layer and one or a plurality of periods of the binary coating plus single fluoride coating, the edge is masked during the coating of the face to prevent the edge from being coated with the binary fluoride and single fluoride. The optional $SiO_2$ protective layer is applied at the end of face coating in both the foregoing instances. When the entire coating process is complete, that is, the edge and face both coated, the adhesive can be applied to the at least a portion of the edge coat for mounting the element in a holder. The thickness of the base $AlF_3$ layer on the face and the edge is in the range of 10-25 nm and 350-550 nm, respectively. Within each period, the thickness the binary fluoride layer A/B is in the range of 25 nm to 75 nm and the thickness of the thermally deposited, non-densified metal fluoride is in the range of 25-45 nm. When a plasma modified $SiO_2$ layer is applied over the last period the $SiO_2$ layer has a thickness in the range of 10-70 nm.

Thus, in one aspect the disclosure is directed to an optical element for use in below 300 nm photolithography consisting of a crystal optic having two faces and an edge surface formed by said faces, a base coating of a thermally deposited, plasma-modified $AlF_3$ deposited on at least portion of said edge surface;

a base coating of thermally deposited $AlF_3$ on the faces of the optic; and one of a plurality of periods consisting of (1) a selected thermally co-deposited, non-modified binary fluoride coating layer and (2) a thermally deposited, non-modified metal fluoride layer deposited on the faces base coating, the selected binary fluoride layer being the first deposited period layer and the selected metal fluoride layer being second deposited period layer;

wherein:

said fluoride coating materials are transmissive to UV curing radiation and transmit less than 5% of any below 300 nm radiation striking said selected coating materials, AND the co-deposited binary metal fluoride coating is an A/B type coating where A is selected from the group consisting of $MgF_2$ and $AlF_3$ and B is a lanthanide series metal fluoride. After all coatings were applied, a UV-curable adhesive was applied to at least part of said edge $AlF_3$ coating for mounting said optic into a holder.

In another aspect the disclosure is directed to a method for coating the edge of an optic, said method comprising:

providing a coating apparatus having a vacuum chamber having vacuum chamber walls having an exterior surface and an interior surface, and, located within the vacuum chamber:

ceramic heaters for generating infrared radiation, at least one basket carrying plate and at least one optical element carrying basket, in said carrying plate, one or a plurality of optics in said at least one carrying basket, thermal evaporation sources to supply, heat and evaporate the selected coating materials deposited on the edge and faces surface of said optic, and a plasma source;

equalizing the temperature ramping profile of the optic-carrying basket to that of optic itself by partially thermally insulating the outside of the basket;

extending the radiation spectrum of apparatus' ceramic heaters into absorption band of the optic being coated such that the optic is heated by said radiation, said extension being done by adjusting the power supplied to the ceramic heaters;

thermally evaporating selected coating materials onto the faces of the optic to form a coating thereon, said of an $AlF_3$ base layer and one or a plurality of periods of (1) a selected thermally co-deposited, non-modified binary fluoride coating layer and (2) a thermally deposited, non-modified metal fluoride layer deposited on the faces' base layer, the selected binary fluoride layer being the first deposited period layer and the selected metal fluoride layer being second deposited period layer;

cooling the optic, masking the optic's faces to prevent further coating on the faces, returning the optic to the coating apparatus; and thermally evaporating and plasma modifying an $AlF_3$ layer deposited onto at least a portion of the edge of the optic to thereby form an optic having at least a portion of its edge coated and a coating on its faces. In addition, mirror-like foils are used to insulate the carrying plate and the interior walls of the chamber, and to partially insulate the carrying baskets. After all coating is completed, the method, optionally, further comprises heating treating the optic at a temperature in the range of in the 275-325° for a time in the range of 0.5 hour to 3 hours.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

We claim:

1. An optical element for use in below 300 nm photolithography consisting of:

a crystal optic having two faces and an edge surface formed by said faces, a base coating of a thermally deposited, plasma-modified $AlF_3$ deposited on at least portion of said edge surface;

a base coating of thermally deposited $AlF_3$ on the faces of the optic; and one of a plurality of periods consisting of (1) a selected thermally co-deposited, n binary fluoride coating layer and (2) a thermally deposited, metal fluoride layer deposited on the faces base coating, the selected binary fluoride layer being the first deposited period layer and the selected metal fluoride layer being second deposited period layer;

wherein:

said fluoride coating materials are transmissive to UV curing radiation and transmit less than 5% of any below 300 nm radiation striking said selected coating materials, the co-deposited binary metal fluoride coating is an A/B coating where A is selected from the group consisting of $MgF_2$ and $AlF_3$ and B is a lanthanide series metal fluoride; and an UV-curable adhesive applied to at least part of said edge $AlF_3$ coating for mounting said optic into a holder.

2. The optical element according to claim 1, wherein the A/B binary coating material on each face is selected from the group consisting of $AlF3/GdF_3$, $MgF_2/GdF_3$, $MgF_2/LaF_3$ and $AlF_3/LaF_3$; and wherein the composition of A/B, in weight percent, is A is in the range of 5-20wt % and B is in the range of 80-95wt %.

3. The optical element according to claim 1, wherein the thickness of the base $AlF_3$ layer on the face and the edge is in the range of 10-25 nm and 350-550 nm, respectively.

4. The optical element according to claim 1, wherein, within each period, the thickness the binary fluoride layer A/B is in the range of 25 nm to 75 nm.

5. The optical element according to claim 1, wherein, within each period, the thickness o thermally deposited metal fluoride is in the range of 25-45 nm.

6. The optical element according to claim 1, wherein the last period is over-coated with an plasma-densified $SiO_2$ layer having a thickness in the range of 10-70 nm.

7. The optical element according to claim 1, wherein in each period the selected binary fluoride is $AlF_3/GdF_3$ and the thermally deposited, metal fluoride layer is $AlF_3$.

8. The optical element according to claim 1, wherein, within each period, the thickness the binary fluoride layer A/B is in the range of 25nm to 75 nm.

9. The optical element according to claim 1, wherein, within each period, the thickness o thermally deposited metal fluoride is in the range of 25-45 nm.

10. The optical element according to claim 1, wherein within the number of periods is in the range of 1-5.

11. A method for coating the edge of an optic, said method comprising:

providing a coating apparatus having a vacuum chamber having vacuum chamber walls having an exterior surface and an interior surface, and cooling water tubes within said walls; and, located within the vacuum chamber:

ceramic heaters for generating infrared radiation, at least one basket carrying plate and at least one optical element carrying basket, in said carrying plate, one or a plurality of optics in said at least one carrying basket, thermal evaporation sources to supply, heat and evaporate the selected coating materials deposited on the edge and faces surface of said optic, and a plasma source;

equalizing the temperature ramping profile of the optic-carrying basket to that of optic itself by partially thermally insulating the outside of the basket;

extending the radiation spectrum of apparatus' ceramic heaters into absorption band of the optic being coated such that the optic is heated by said radiation, said extension being done by adjusting the power supplied to the ceramic heaters;

thermally evaporating selected coating materials onto the faces of the optic to form a coating thereon, said of an $AlF_3$ base layer and one or a plurality of periods of (1) a selected thermally co-deposited binary fluoride coating layer and (2) a thermally deposited metal fluoride layer deposited on the faces' base layer, the selected binary fluoride layer being the first deposited period layer and the selected metal fluoride layer being second deposited period layer;

cooling the optic, masking the optic's faces to prevent further coating on the faces, returning the optic to the coating apparatus; and thermally evaporating and plasma modifying an $AlF_3$ layer deposited onto at least a portion of the edge of the optic to thereby form an optic having at least a portion of its edge coated with a thermally deposited, plasma-modified $AlF_3$ layer on at least a portion of the edge.

12. The method according to claim 11, wherein, optionally, said method further comprises heating treating said optic at a temperature in the range of in the 275-325° for a time in the range of 0.5 hour to 3 hours after all coating is completed.

13. The method according to claim 11, wherein in said plurality of periods, the binary fluoride coating is an A/B where A is selected from the group consisting of $MgF_2$ and $AlF_3$ and B is a lanthanide series metal fluoride.

14. The method according to claim 13, wherein A/B binary coating material on each face is selected from the group consisting of $AlF3/GdF_3$, $MgF_2/GdF_3$, $MgF_2/LaF_3$ and $AlF_3/LaF_3$; and wherein the composition of A/B, in weight percent, is A is in the range of 5-20 wt % and B is in the range of 80-95 wt %.

* * * * *